Oct. 17, 1961 H. A. DVORAK 3,004,505

SOLDERING DEVICE

Filed Sept. 30, 1957 2 Sheets-Sheet 1

INVENTOR
H.A. DVORAK
BY C.B. Hamilton
ATTORNEY

Oct. 17, 1961 H. A. DVORAK 3,004,505

SOLDERING DEVICE

Filed Sept. 30, 1957 2 Sheets-Sheet 2

INVENTOR
H. A. DVORAK
BY H. J. Winegar
ATTORNEY

3,004,505
SOLDERING DEVICE

Howard A. Dvorak, Brookfield, Ill., assignor to Western Electric Company, Incorporated, New York, N.Y., a corporation of New York Filed Sept. 30, 1957, Ser. No. 687,024
4 Claims. (Cl. 113—126)

This invention relates to methods of and devices for soldering and more particularly to methods of and devices for soldering lead wires of electrical components to printed wiring boards.

An object of this invention is to provide new and improved methods of and devices for soldering lead wires of electrical components to printed wiring boards to which the wires are clinched.

Another object of this invention is to provide new and improved methods of and devices for flowing molten solder over a lead wire of an electrical component clinched onto the edge of a printed wiring board.

A further object of this invention is to provide new and improved methods of and devices for projecting a fountain of molten solder onto a lead wire of an electrical component clinched onto an edge of a printed wiring board.

With these and other objects in mind, the present invention contemplates an inner vat having side walls which constitute an inner pair of spaced weirs which support a printed wiring board having lead wires of electrical components clinched onto its edges. A larger open vat encloses the first vat and is provided with side walls constituting an outer pair of weirs of greater height than the inner pair and positioned parallel to the inner pair to form passages therebetween. Molten solder is forced upward from the larger vat through the passages between the inner and outer pairs of weirs and normally flows over the inner pair of weirs into the inner vat. When a printed wiring board is positioned on the inner pair of weirs, solder is forced upward over the clinched lead wires and flows over the outer pair of weirs, thereby soldering the lead wires to the printed wiring boards.

Other objects and advantages of the invention will become apparent by reference to the following detailed description and the accompanying drawings illustrating a preferred embodiment of the invention, in which FIG. 1 is a view, partly in section, of a device embodying the principles of the invention with a portion broken away to show the structure of an outer vat from which solder is forced to perform a soldering operation on a printed circuit board;

Figures 1, 2, 3, 4:
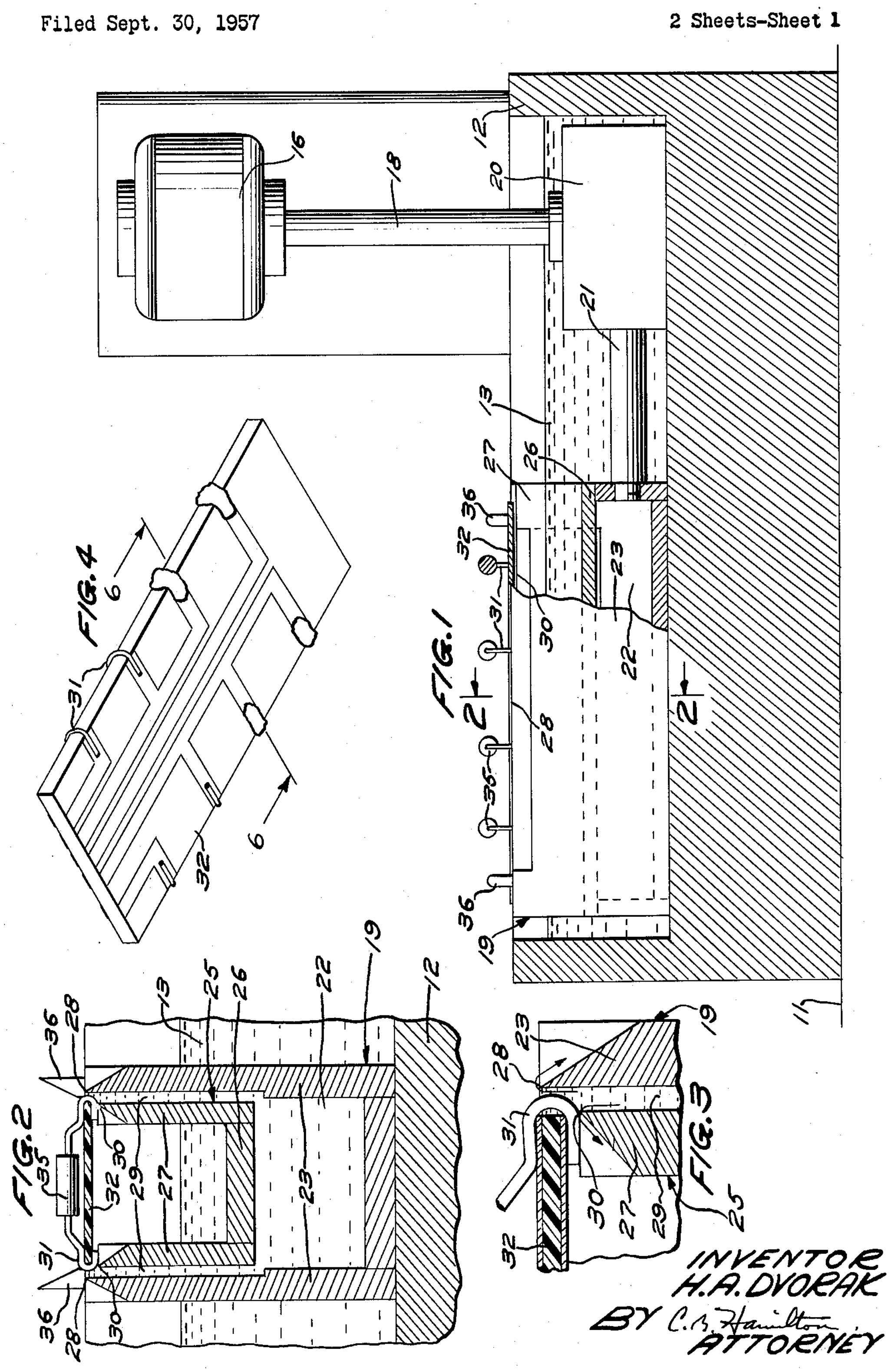
FIG. 2 is an enlarged, fragmentary, vertical, sectional view, taken on line 2—2 of FIG. 1.
FIG. 3 is an enlarged, fragmentary, sectional view, similar to a portion of FIG. 2, showing the manner in which the printed wiring board rests upon an inner pair of walls.
FIG. 4 is an enlarged perspective view showing a comparison between lead wires which have and those which have not been soldered to a printed wiring board.
Figure 5:
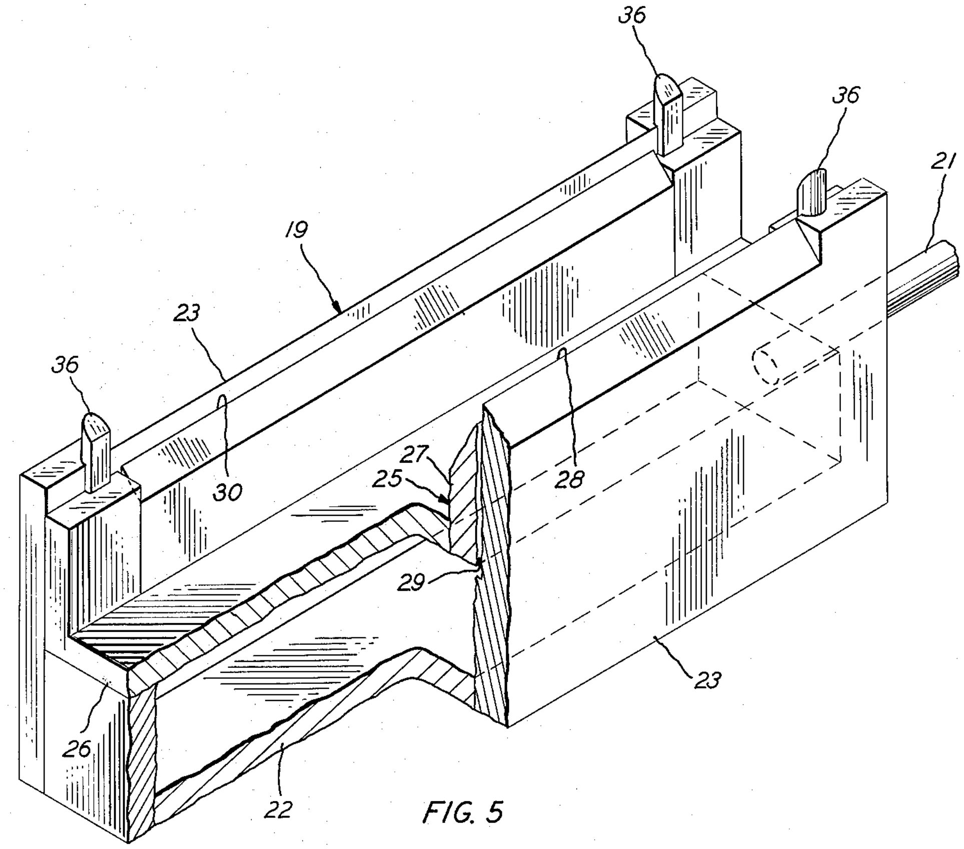
FIG. 5 is an enlarged perspective view of portions of the device shown in FIG. 1.
Figure 6:
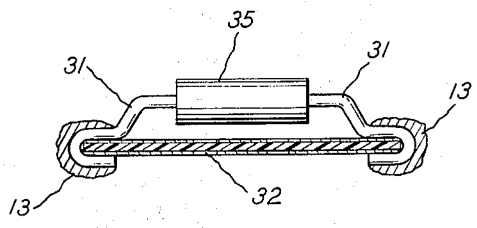
FIG. 6 is an enlarged, vertical, sectional view taken along line 6—6 of FIG. 4.

Referring now in detail to the drawings, there is shown an open tank 12 containing a reservoir of molten solder 13. A motor 16 mounted above the tank 12 rotates a shaft 18 to drive a pump 20 to force solder from the tank 12 through a tubular member 21 and into a chamber 22 within an outer vat 19.

The outer vat 19 has a pair of side walls 23—23 which extend upward and terminate in knife-edges 28—28, as best illustrated in FIG. 2, to constitute a pair of outer weirs over which molten solder may flow from the chamber 22 of the vat 19 back into the tank 12. An open-ended inner vat 25 is mounted within the outer vat 19 and is interconnected through its open ends with the tank 12. The inner vat 25 is provided with side walls 27—27 which extend upward and terminate in knife-edges 30—30 to constitute inner weirs of less height than the outer weirs defined by the knife edges 28—28 of the outer vat 19. The walls 23—23 and 27—27 are spaced to form passages 29—29 through which solder is forced from the chamber 22 when the motor 16 and pump 20 are operated.

The inner walls 27—27 are adapted to support a printed wiring board 32 having lead wires 31 of electrical components 35 clinched onto its edges, as best illustrated in FIGS. 2, 3 and 4. Guide lugs 36 mounted on the walls 23—23 engage the printed wiring board 32 to insure that it is properly seated on the inner walls 27—27. Solder normally flows upward through the passages 29—29, over the inner knife edges 30—30 and into the inner vat 25 and from the vat 25 back into the tank 12 through the open ends of the vat 25. When the printed wiring board 32 is positioned on the inner walls 27—27, the solder flows upward through the passages 29—29 and over the outer knife edges 28—28, the printed wiring board 32 serving to prevent all of the solder from flowing over the inner walls 27—27. The knife-edges 28—28 and 30—30 serve to facilitate the flow of solder over the walls 23—23 and 27—27, respectively.

In operation of the heretofore described embodiment of the invention, a printed wiring board 32 having lead wires 31 of electrical components 35 clinched onto its edges is manually positioned on the inner walls 27—27, as illustrated in FIGS. 1, 2 and 3, the guide lugs 36 serving to properly position the board 32. The motor 16 is then actuated to operate the pump 20 for forcing solder into the chamber 22 and upward through the passages 29—29 past the clinched lead wires and over the outer walls 23—23. The solder flowing over the clinched lead wires solders them to the printed wiring board 32.

It is to be understood that the above-described arrangement is simply illustrative of the application of the principles of this invention. Numerous other arrangements may be readily devised by those skilled in the art which will embody the principles of the invention and fall within the spirit and scope thereof.

What is claimed is:

1. The method of soldering an edge-clinched lead wire to metallic circuit patterns on opposite faces of a flat printed circuit board, said lead wire being clinched about an edge of the printed circuit board in a generally U-shaped configuration and in contact with metallic circuit patterns lying on opposite faces of the board and extending to said edge, which method comprises the steps of forcing a stream of molten solder under pressure through an opening to create a substantially vertical solder fountain of a predetermined height, and placing said edge with the lead wire clinched thereabout partially across the opening in a manner such that only a part of the solder stream impinges upon portions of the circuit pattern and the lead wire on the lower face of the board and the opening is restricted by the edge of the board to an extent such that the remaining part of the stream is forced to rise vertically adjacent to said edge to an elevation substantially equal to that of the circuit pattern on the lower face of the board so as to wet portions of the circuit pattern and the lead wire on the top face of the board.

2. The method of soldering an edge-clinched lead wire to portions of metallic circuit patterns positioned on opposite faces of a flat printed circuit board and immediately adjacent to one edge of the board, which method comprises directing a stream of molten solder substantially vertically from a supply thereof, confining the stream of solder to a passageway between two spaced vertical walls, the upper edge of a first of said walls lying in a first horizontal plane spaced vertically above a second horizontal plane containing the upper edge of the second wall a distance substantially equal to the thickness of the board, forcing the stream of molten solder to flow upwardly between the walls at a rate such that normally all of the solder stream flows over the upper edge of the lower wall and returns to the supply, and positioning the board in a generally horizontal attitude with the bottom face thereof spaced a distance above the second plane substantially less than the thickness of the board and with said one edge thereof extending across the upper edge of the second wall and partly into the solder stream so as to allow only a portion of the solder stream to flow over the upper edge of the lower wall to wet edge portions of the circuit pattern on the lower face of the board and to cause the remaining portion of the solder stream to rise vertically between said edge of the board and the higher first wall to a height sufficient to wet edge portions of the circuit pattern on the upper face of the board and to flow over the upper edge of the higher wall and return to the supply.

3. A device for soldering lead wires of electrical components to metallic circuit patterns on opposite faces of a flat, rectangular, printed circuit board, the lead wires being clinched about opposite side edges of the board, each lead wire being clinched in generally a U-shaped configuration and in contact with portions of the circuit patterns extending to said edges on opposite faces of the board, which device comprises an outer, generally rectangular vat having a pair of vertical side walls of a predetermined height spaced apart a distance slightly greater than the width of the printed circuit board, an inner, generally rectangular vat positioned within the outer vat and having a pair of vertical side walls of a height less than said predetermined height such that the top edges of said last-mentioned side walls lie in a horizontal plane spaced below a horizontal plane containing the top edges of the outer vat side walls by an amount substantially equal to the thickness of the printed circuit board, said inner vat side walls being spaced apart a distance slightly less than the width of the printed circuit board and spaced from the corresponding side walls of the outer vat so as to form a pair of vertical restricted passageways communicating with the interior of the outer vat, a reservoir of molten solder communicating with the interior of the outer vat, supporting and locating means for positioning the printed circuit board in a horizontal attitude between the side walls of the outer vat with the bottom face of the board spaced a distance of the order of the thickness of the lead wires above the plane containing the top edges of the inner vat side walls and with the side edges of the board projecting partly across corresponding ones of passageways between the walls and means for forcing molten solder from the reservoir into the interior of the outer vat and upwardly through said passageways to establish a predetermined flow rate through the passageways such that before the board is positioned on the supporting and locating means all of the solder stream flowing through each passageway flows over the top edge of the side wall of the inner vat and returns to the reservoir whereas after the board is so positioned only a part of the solder stream in each passageway flows over the top edge of the side wall of the inner vat to wet edge portions of the circuit pattern on the lower face of the printed circuit board and the remaining part of the solder stream from each passageway is forced to rise adjacent to the corresponding side edge of the board and to flow over the top edge of the corresponding side wall of the outer vat so that portions of the metallic circuit pattern on the top face of the board and immediately adjacent to the side edges thereof are wet by the solder streams.

4. A device for soldering an edge-clinched, metal, lead wire of an electrical component to metallic circuit patterns on opposite faces of a flat, relatively thin, printed circuit board, the edge-clinched lead wire being prepositioned thereon in a generally U-shaped configuration and in contact with portions of the metallic circuit patterns extending to the edge of the board on opposite faces thereof, which device comprises two spaced plates arranged substantially vertically and parallel to one another, the upper edge of the first plate lying in a horizontal plane spaced vertically above a second horizontal plane containing the upper edge of the second plate a distance substantially equal to the thickness of the printed circuit board, the plates being closely spaced to provide a restricted passageway therebetween for molten solder, a reservoir of molten solder communicating with said passageway between the plates, means for continuously forcing molten solder from the reservoir to fill the passageway between the plates with a molten solder stream having a predetermined flow rate such that normally all of the solder stream upon issuing from the passageway flows over the top edge of the second plate and returns to the reservoir for recirculation, and means for locating and supporting the printed circuit board in a substantially horizontal attitude above the top edge of the second plate with a portion of the edge-clinched lead wire in contact with the metallic printed circuit pattern on the lower face of the board located substantially on the top edge of the second plate so that the printed circuit board is spaced slightly above said last-mentioned top edge, said supporting and locating means also positioning the printed circuit board so that the edge having the lead wire crimped thereabout projects partly across the passageway between the plates, said predetermined flow rate being such that, when the board is so positioned by the supporting and locating means, only a part of the issuing molten solder stream flows over the top edge of the second plate and wets edge portions of the circuit pattern on the lower face of the printed circuit board and the remaining part of said solder stream is forced to rise and flow over the top edge of the first plate whereby the remaining part of the solder stream in flowing between the edge of the board and top edge of the first plate wets portions of the printed circuit pattern on the upper face of the board immediately adjacent to the edge and portions of the lead wire adjacent thereto.

References Cited in the file of this patent

UNITED STATES PATENTS

| | | |
|---|---|---|
| 812,955 | Sharp | Feb. 20, 1906 |
| 937,524 | Hartlove | Oct. 19, 1909 |
| 1,988,955 | Nehmert | Jan. 22, 1935 |
| 2,264,703 | Lenz | Dec. 2, 1941 |
| 2,770,875 | Zimmerman | Nov. 20, 1956 |
| 2,771,048 | Zimmerman | Nov. 20, 1956 |
| 2,771,049 | Fish | Nov. 20, 1956 |
| 2,869,497 | Lehner | Jan. 20, 1959 |
| 2,895,683 | Dvorak | July 21, 1959 |

UNITED STATES PATENT OFFICE
CERTIFICATE OF CORRECTION

Patent No. 3,004,505 October 17, 1961

Howard A. Dvorak

It is hereby certified that error appears in the above numbered patent requiring correction and that the said Letters Patent should read as corrected below.

Column 2, line 65, for "lower" read -- upper --.

Signed and sealed this 24th day of July 1962.

(SEAL)
Attest:

ERNEST W. SWIDER
Attesting Officer

DAVID L. LADD
Commissioner of Patents